TELESCOPIC VOLTAGE AMPLIFIER

Filed March 2, 1956

INVENTORS:
WILLIAM S. ECKESS,
KENNETH I. SHERMAN,
JOE E. DEAVENPORT,
BY Kingsland, Rogers & Ezell
ATTORNEYS United States Patent Office 2,888,525

Patented May 26, 1959

2,888,525

TELESCOPIC VOLTAGE AMPLIFIER

William S. Eckess, Florissant, Kenneth I. Sherman, St. Louis, and Joe E. Deavenport, St. Louis County, Mo., assignors to The Emerson Electric Manufacturing Company, St. Louis, Mo., a corporation of Missouri Application March 2, 1956, Serial No. 569,151

12 Claims. (Cl. 179—171)

The present invention relates generally to electronic circuits, and more particularly to a multistage transistor circuit arranged to produce an output voltage which exceeds in magnitude the maximum direct current collector voltage of the individual transistors.

Inasmuch as most transistors have a maximum direct current collector voltage rating of only some 20 or 25 volts, it becomes necessary to arrange a plurality of transistors in cascade when peak output voltage swings greater than such rated values are required. Ordinarily, however, what would otherwise seem to be a suitable cascade arrangement will exhibit the major disadvantage of having high output impedance. In other words, in order to make maximum use of an available high voltage swing, it is necessary to develop the full voltage swing across a relatively high output impedance.

It has been found that the difficulty here mentioned can be overcome by providing an emitter-follower stage for each of the original telescoping stages. With such an arrangement, the desired magnitude of voltage swing is retained and a desirably low output impedance is provided. Moreover, the arrangement lends itself to the amplification of both A.C. and D.C. voltages.

It is an object of the present invention, therefore, to provide a novel transistor telescopic voltage amplifier for producing an output voltage which exceeds the limitations of the individual transistors.

It is another object of the invention to provide a novel transistor telescopic voltage amplifier which lends itself to amplification of both D.C. and A.C. voltages.

It is another object of the invention to provide a novel transistor telescopic voltage amplifier which employs a plurality of both pnp type transistors and npn type transistors in complementary symmetrical arrangement.

It is another object of the invention to provide a novel transistor telescopic voltage amplifier having low output impedance.

The foregoing, along with additional objects and advantages, will be apparent from the following description taken with the accompanying drawing, in which.

Figure 1:
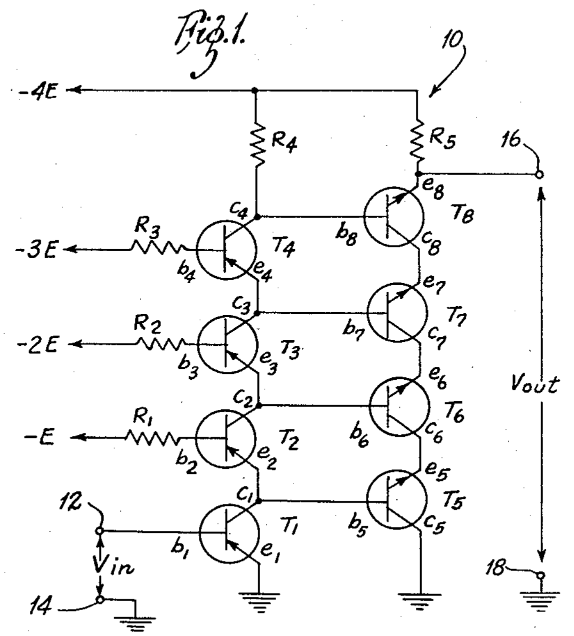
Figure 1 is a schematic diagram of a telescopic voltage amplifier conforming to the teachings of the present invention.

Referring to the drawing more particularly through mention of the reference characters thereon, the numeral 10 designated generally a circuit arranged in accordance with the present invention. As is clear from Figure 1 of the drawing, the circuit 10 includes a pair of input terminals 12 and 14, the latter being grounded and the former being connected directly to the base terminal $b_1$ of a transistor $T_1$. The transistor $T_1$ is of the pnp type. It has its emitter terminal $e_1$ grounded, while its collector terminal $c_1$ is connected to the emitter $e_2$ of a pnp transistor $T_2$ and also to the base terminal $b_5$ of an npn transistor $T_5$. The base $b_2$ of the transistor $T_2$ is connected through a resistor $R_1$ to a source of negative voltage indicated by the symbol —E. The collector terminal $c_2$ of the transistor $T_2$ is connected to the emitter $e_3$ of a pnp transistor $T_3$ and also to the base $b_6$ of an npn transistor $T_6$. The base $b_3$ of the transistor $T_3$ is connected through a resistor $R_2$ to a negative voltage of twice the magnitude of the aforementioned voltage source —E, or in other words to a source —2E. The collector $c_3$ of the transistor $T_3$ is connected directly to the emitter $e_4$ of a pnp transistor $T_4$ and also to the base $b_7$ of an npn transistor $T_7$. Once more, the base $b_4$ of the transistor $T_4$ is connected through a resistor $R_3$ to a negative voltage source —3E, which is three times the magnitude of the source —E. As before, the collector $c_4$ of the pnp transistor $T_4$ is connected directly to the base $b_8$ of an npn transistor $T_8$. The collector $c_4$ is also connected through a resistor $R_4$ to a negative voltage source —4E, four times the magnitude of the source —E.

Returning now to the first mentioned npn transistor $T_5$, it will be observed that the collector $c_5$ thereof is connected to ground, while the emitter $e_5$ of this transistor is connected directly to the collector $c_6$ of the transistor $T_6$. In like manner, the emitter $e_6$ of the latter transistor is connected directly to the collector $c_7$ of the transistor $T_7$, and the emitter $e_7$ is connected to the collector $c_8$. The emitter $e_8$ of the transistor $T_8$ is connected through a resistor $R_5$ to the aforementioned voltage source —4E. This emitter terminal $e_8$ is also connected to an output terminal 16 which, along with a grounded output terminal 18, completes the circuit 10.

Figure 2:
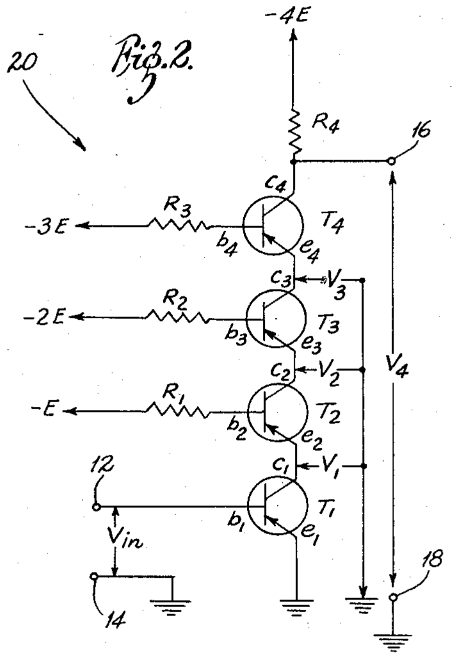
Figure 2 is a schematic diagram of a voltage amplifying circuit employing transistors in cascade arrangement.

The operation of the voltage amplifier circuit 10 is such as to make it useful as a D.C. or A.C. amplifier in almost any television, radar, or communications application requiring a large voltage swing, such as in the deflection circuits of cathode ray tubes or in radar range sweep voltage circuits where the range resolution increases with available voltage swing. The functioning of the circuit 10 may be best explained through comparison with the circuit of Figure 2 and by the curves of Figure 3. The circuit of Figure 2, designated generally by the numeral 20 is identical with the circuit 10 of Figure 1, except for the elimination of the npn transistors $T_5$, $T_6$, $T_7$ and $T_8$ and also the resistor $R_5$. The output terminal 16 is, in the circuit 20, then connected directly to the collector terminal $c_4$ of the transistor $T_4$.

Figure 3:
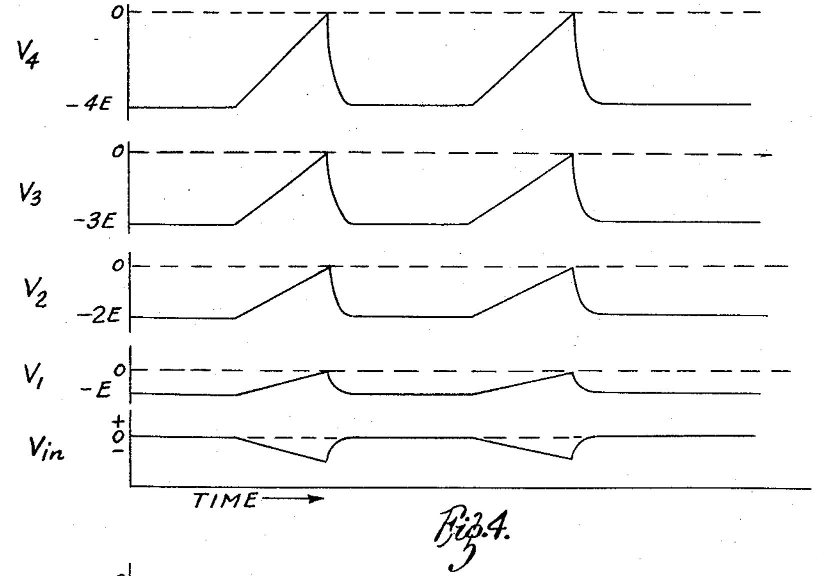
Figure 3 is a set of curves illustrating the operation of the circuit of Figure 2.

Considering the circuit 20 and assuming an input voltage wave form such, for example, as indicated by the curve $V_{in}$ in Figure 3, an inverted wave having the general form of the curve $V_1$ will exist at the collector terminal $c_1$. This phenomenon is, of course, well understood in the art, as is the fact that input voltage waves of different form may be imposed across the terminals 12 and 14. It may be mentioned also that the curve of $V_{in}$ is shown with an exaggerated ordinate scale which has no correspondence with the ordinate scale of the curve $V_1$. In other words, the curves $V_{in}$ and $V_1$ are intended to be compared as to phase relationship and not to illustrate gain in the first transistor stage.

The output voltage of the transistor $T_1$ determined by the grounded-emitter current gain factor along with the load impedance, may not exceed the voltage rating of the transistor itself. The voltage gain in this stage, represented by $A_1$, is usually between 50 and 100 and may be expressed as:

$$A_1=\frac{-V_1}{V_{in}}$$

Returning to the voltage wave form of $V_1$, Figure 3 shows that the voltage output from the first stage may swing from $-E$ to zero volts. It will be noted, incidentally, that the negative voltages used in this circuit stem from the use of pnp type transistors.

The transistor $T_2$ is connected in the configuration of a grounded base amplifier with the relatively large unbypassed resistor $R_1$ in the base lead. With an input voltage $V_1$ varying from $-E$ to zero volts, the voltage $V_2$, measured with respect to ground, may swing from $-2E$ to zero volts without exceeding the rating of the transistor $T_2$, which rating, however, must be at least equal to the magnitude of $-E$. As will be generally understood, the voltage source $-E$ keeps the base $b_2$ and emitter $e_2$ biased so that voltage between the collector $c_2$ and either the base $b_2$ or emitter $e_2$ may never exceed the magnitude of E. The voltage gain through the transistor $T_2$, represented by the ratio of the output to input voltage, may be expressed as:

$$A_2=\frac{V_2}{V_1}=\frac{2E}{E}=2$$

Attention is directed to the fact that there is no phase shift between the emitter $e_2$ and the collector $c_2$, or between the voltage curves $V_1$ and $V_2$ as there was in the first transistor stage. This is due, of course, to the employment of the transistor $T_2$ as a grounded base amplifier in contrast to the employment of the transistor $T_1$ as a grounded emitter amplifier.

The operation of transistor $T_3$ is similar to that of the transistor $T_2$ with the exception that the former, being biased to a voltage of $-2E$, swings between this value and zero volts. The gain in the third stage is given by the expression:

$$A_3=\frac{V_3}{V_2}=\frac{3E}{2E}=1.5$$

In similar fashion, the fourth stage transistor $T_4$, being biased to a voltage of $-3E$, will provide a maximum voltage swing from $-4E$ to zero volts, although the maximum voltage across the transistor $T_4$ never exceeds E. This appears as output across the output terminals 16 and 18. The gain in the fourth stage is given by the expression:

$$A_4=\frac{V_4}{V_3}=\frac{4E}{3E}=1.33$$

It will be understood that the foregoing description of operation assumes that each of the transistors $T_1$, $T_2$, $T_3$ and $T_4$ has a voltage rating within that represented by the magnitude E. Thus, despite the fact that the maximum voltage across any of the transistors never exceeds E, a maximum output voltage swing from $-4E$ to zero volts is available. The overall voltage gain of the amplifier 20 is given by the expression:

$$A_{out}=\frac{V_4}{V_{in}}=(-A_1)(A_2)(A_3)(A_4)$$

If, for example, an arbitrary value of 60 be assumed for $A_1$ and the above-mentioned values be substituted for $A_2$, $A_3$, and $A_4$, the amplifier circuit 20 would provide an overall gain of $-240$.

With the transistors $T_1$, $T_2$, $T_3$ and $T_4$ selected to have equal current amplification factors and with proper values for the resistors $R_1$, $R_2$ and $R_3$, the output voltage swing divides equally across each transistor. Thus divided, the output voltage $V_{out}$ can swing approximately 90% of 4E with very low distortion.

Figure 4:
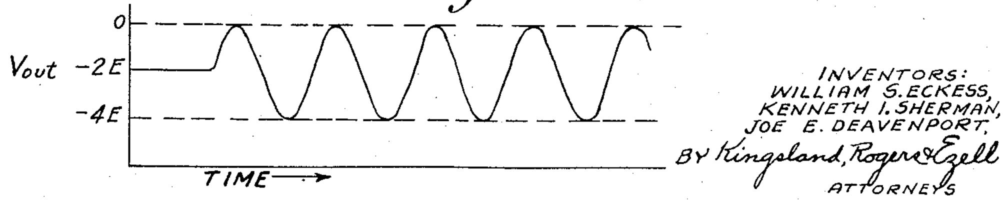
Figure 4 is a curve illustrating the output of the amplifier of Figure 1.

When it is desired to amplify alternating current energy in a circuit such as 20, the base $b_1$ of the first stage transistor $T_1$ should be biased negative enough to permit a drop of $-2E$ volts across the resistor $R_4$. This will provide for a maximum A.C. voltage amplitude of 2E above or below the midpoint thus selected. This is illustrated in the curve of Figure 4.

It will be observed that all of the current that flows in the circuit 20 is drawn from the emitter $e_1$ of the first stage transistor $T_1$. Obviously then, the current capacity of the transistor $T_1$ limits the total number of transistors that can be successfully stacked or cascaded in the manner of Figure 2. If, however, it is desired to exceed this limiting value of current, parallel combinations can be used to increase the number of stages.

Clearly, in order to take maximum advantage of the high voltage swing that can be obtained in the manner above-described, it is necessary to overcome the high output impedance that is inherent in the arrangement of the circuit 20. In this connection, it has been found that the circuit 10 of Figure 1 will enable the voltage gained in the stacked transistors $T_1$, $T_2$, $T_3$ and $T_4$ to be developed across a desirably low output impedance. In other words, the addition of transistors having opposite type carrier injection in complementary relation to the respective voltage amplifying transistors $T_1$, $T_2$, $T_3$ and $T_4$ provides, in effect, a current amplifier which produces approximately the same output voltage swing across the resistor $R_5$ as was obtained across the resistor $R_4$ of Figure 2. The transistors $T_5$, $T_6$, $T_7$ and $T_8$, each in grounded collector configuration, are arranged so that the aforementioned voltages $V_1$, $V_2$, $V_3$ and $V_4$ are applied directly to the respective transistor bases $b_5$, $b_6$, $b_7$ and $b_8$. These voltages then appear at the emitters $e_5$, $e_6$, $e_7$ and $e_8$ in phase with the respective input voltages and with approximately the same amplitude.

It is to be understood that, notwithstanding the illustration herein of pnp transistors being employed in the voltage amplifying section and npn transistors in the current amplifying section of the circuit 10, the two sections may each employ transistors of the other type. However, it is the employment of opposite types of transistors in the two sections that enables the circuit 10 to be used for either A.C. or D.C. signals without the necessity for intercoupling networks. The employment of only a single type of transistor in both the voltage amplifying and the current amplifying sections of an amplifier of this kind would, on the other hand, limit the device to the amplification of A.C. energy, since the signal swing across one branch of transistors will be 180° out of phase with the signal across the other, thereby making the biasing levels and signal levels different for each transistor.

Clearly, there has been disclosed a telescopic voltage amplifier which fulfills the objects and advantages sought therefor.

It is to be understood that the foregoing description and the accompanying drawing have been given only by way of illustration and example. It is further to be understood that changes in the circuit, including rearrangement of elements, the substitution of equivalent elements, and the changing of electrical values, all of which will be readily apparent to those skilled in the art, are contemplated as being within the scope of the invention, which is limited only by the claims which follow.

What is claimed is:

1. A voltage amplifier comprising, in combination, an input terminal and an output terminal, a plurality of transistors including PNP-type and NPN-type connected between said terminals, there being a PNP-type transistor for each NPN-type transistor, the transistors of one of said types being individually biased in progressive degree and connected in cascade for current amplification, and a direct interconnection between the collector of the one and the base of the other of each pair of transistors of complementary type.

2. The combination of claim 1 wherein the transistors connected for voltage amplification are connected with a first transistor in grounded emitter arrangement and with the remaining transistors in grounded base arrangement.

3. The combination of claim 2 wherein the transistors connected for current amplification are cascaded in emitter-follower relationship, each in grounded collector arrangement receiving base input from a respective complementary transistor of opposite type.

4. A voltage amplifier comprising, in combination, an input terminal and an output terminal, a plurality of transistors including PNP-type and NPN-type connected between said terminals, there being a PNP-type transistor for each NPN-type transistor, the transistors of one of said types being individually biased in stepped progression and connected in cascade with the collector of each except the last connected to the emitter of the next following transistor of similar type, the transistors of the other of said types being connected in cascade with the emitter of each except the last connected to the collector of the next following transistor of similar type, the collector of each transistor of the said one type being also connected to the base of a corresponding transistor of the said other type.

5. The combination of claim 4 wherein said input terminal is connected to the base of the first transistor of the one type and individual biasing means are connected to the bases of the respective remaining transistors of the one type.

6. The combination of claim 5 wherein the individual biasing means each includes an individual source of electrical potential and an individual resistor in series therewith.

7. The combination of claim 6 wherein the individual sources of potential are all of different magnitude, the magnitudes of the individual sources being successively greater from first to last.

8. The combination of claim 7 wherein the magnitude of each individual source of potential is a multiple of the magnitudes of the first.

9. The combination of claim 4 plus a plurality of sources of electrical potential, there being as many of said sources as there are transistors of the one type, an individual resistor connected to each of said sources, said resistors being also connected one to the base of each transistor of the one type other than the first thereof and one to the collector of the last thereof, and an additional resistor connected between the emitter of the last transistor of the other type and the source of potential connected to the resistor connected to the collector of the last transistor of the one type.

10. The combination of claim 9 wherein the several sources of potential are of different magnitudes, the source in the base circuits of the transistors of the one type following successively after the first being of progressively greater magnitude, and the source in the collector circuit of the last transistor of the one type being the greatest in magnitude.

11. The combination of claim 10 wherein each source of potential other than that of least magnitude is substantially equal in magnitude to the magnitude of one of the other sources plus the magnitude of the source of least magnitude.

12. The combination of claim 11 wherein the input terminal is connected to the base of the first transistor of the one type, and the output terminal is connected to the emitter of the last transistor of the other type.

References Cited in the file of this patent

UNITED STATES PATENTS 2,631,198 Parisoe ________________ Mar. 10, 1953

OTHER REFERENCES

Sziklai: "Transistor Circuits and Applications," Electronic Engineering, vol. 25, pp. 358–364, published September 1953.